(12) United States Patent
Takenaka et al.

(10) Patent No.: US 7,066,344 B2
(45) Date of Patent: Jun. 27, 2006

(54) MASK FILM, ITS MANUFACTURING METHOD, AND MANUFACTURING METHOD OF CIRCUIT BOARD USING THE SAME

(75) Inventors: Toshiaki Takenaka, Kyoto (JP); Toshikazu Kondo, Osaka (JP); Kunio Kishimoto, Osaka (JP); Shinji Nakamura, Osaka (JP); Fumio Echigo, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 575 days.

(21) Appl. No.: 10/338,642

(22) Filed: Jan. 9, 2003

(65) Prior Publication Data

US 2003/0153197 A1 Aug. 14, 2003

Related U.S. Application Data

(62) Division of application No. 09/573,826, filed on May 18, 2000, now Pat. No. 6,694,612.

(30) Foreign Application Priority Data

May 18, 1999 (JP) ................... 11-136721

(51) Int. Cl.
*H01B 13/00* (2006.01)
(52) U.S. Cl. ................. 213/13; 213/41; 213/47; 213/49; 430/5; 174/258; 174/260; 174/262; 29/829; 29/830; 29/846
(58) Field of Classification Search ............ 216/13, 216/41, 47, 49; 430/5; 174/258, 260, 262; 29/846, 829, 830
See application file for complete search history.

(56) References Cited

U.S. PATENT DOCUMENTS

| | | | |
|---|---|---|---|
| 4,268,614 A | 5/1981 | Ueyama et al. | |
| 4,642,160 A | 2/1987 | Burgess | |
| 4,915,983 A | 4/1990 | Lake et al. | |
| 5,346,750 A | 9/1994 | Hatakeyama et al. | |
| 5,358,604 A | 10/1994 | Lin et al. | |
| 5,591,519 A | 1/1997 | Caron et al. | |
| 5,902,438 A | 5/1999 | Arthur et al. | |
| 5,959,256 A * | 9/1999 | Saida et al. | 174/258 |
| 6,163,957 A | 12/2000 | Jian et al. | |
| 6,368,697 B1 * | 4/2002 | Petti et al. | 428/209 |

FOREIGN PATENT DOCUMENTS

| | | |
|---|---|---|
| EP | 1054582 | 11/2000 |
| EP | 1180921 | 2/2002 |
| JP | 6-268345 | 9/1994 |
| JP | 7-106760 | 4/1995 |

* cited by examiner

*Primary Examiner*—Shamim Ahmed
(74) *Attorney, Agent, or Firm*—McDermott Will & Emery LLP

(57) ABSTRACT

A mask film includes a base material, a parting layer and a non-parting portion placed on the base material. Accordingly, an optimum adhesion strength of the mask film and a prepreg sheet can be maintained, and peeling between the mask film and prepreg sheet can be prevented. Further, by preventing the fusing adhesion between the mask film and prepreg sheet due to heat generated when forming penetration holes, a circuit board having an excellent quality is obtained.

19 Claims, 7 Drawing Sheets

(a)

(b)

MASK FILM, ITS MANUFACTURING METHOD, AND MANUFACTURING METHOD OF CIRCUIT BOARD USING THE SAME

RELATED APPLICATION

This application is a Divisional of U.S. patent application Ser. No. 09/573,826, filed May 18, 2000, now U.S. Pat. No. 6,694,612.

FIELD OF THE INVENTION

The present invention relates to a mask film, a method of manufacturing the same, and a method of manufacturing a circuit board using the same.

BACKGROUND OF THE INVENTION

In the recent trend of smaller size and higher density of electronic devices, there is an increasing demand for multi-layer structure of circuit boards in the fields of industrial and consumer products. In such circuit boards, it is required to develop newly a manufacturing method for connecting circuit patterns of a plurality of layers with inner via holes, and a circuit board structure having a high reliability. As the manufacturing method of the two-sided circuit board, a manufacturing method of circuit board connecting inner via holes with conductive paste is proposed. This conventional manufacturing method of circuit board is explained below.

FIG. 8 is a sectional view of mask film used in manufacture of conventional circuit board. FIG. 9 is a perspective view of a mask film in manufacture of conventional circuit board, showing the position of a large tension.

A conventional mask film 22 has a base material 11, and a parting layer 12 placed on the whole surface of the base material 11. The base material 11 is made of polyethylene terephthalate. In the manufacturing method of two-sided circuit board, the mask film is adhered to both sides of a prepreg sheet so that the parting layer 12 side may be positioned on the surface of the prepreg sheet. The prepreg sheet has a base and a resin impregnated in the base.

Penetration holes are formed in specified positions of the prepreg sheet to which the mask film 22 is adhered.

The penetration holes are filled with conductive paste. The conductive paste filling method comprises a step of putting the prepreg sheet having penetration holes on a table of a general printing press, and a step of applying conductive paste directly from above the mask film 22 by using a squeegee. At this time, the mask film 22 plays the role as printing mask, and also the role of prevention of contamination of the surface of the prepreg sheet.

The mask film 22 is parted from both sides of the prepreg sheet.

A metal foil is overlaid on both sides of the prepreg sheet.

The prepreg sheet having the metal foils is heated and pressed. In this process, the prepreg sheet and metal foils are mutually adhered. In this case, the metal foils adhered to both sides of the prepreg sheet are electrically connected to the conductive paste filling up the penetration holes formed in specified positions.

The both metal foils are selectively etched, and a circuit patterns are formed. Thus, a two-sided circuit board is manufactured.

In this conventional manufacturing method of multilayer board, however, when the prepreg sheet and mask film are adhered, as shown in FIG. 9, the shrinkage stress 30 at four corners of a prepreg sheet 31 is larger than at other positions. Peeling occurs from these four corners. In the subsequent manufacturing process of conveying and handling, peeling expands gradually.

By forming the parting layer 12 of the mask film 22 very thinly to be 0.01 µm or less, pin holes are intentionally formed in the parting layer 12. By these pin holes, the adhesion strength of the prepreg sheet and mask film is maintained.

When forming penetration holes in specified position by heating process such as laser process (in particular, $CO_2$ laser), the polyethylene terephthalate of the mask film 22 is melted by the process heat, and the molten material is fused with components of the prepreg sheet 31. Accordingly, when parting the mask film 22 from the prepreg sheet 31, the resin component or base in the prepreg sheet 31 may be peeled together with the mask film 22.

Depending on presence or absence of penetration holes, the adhesion strength of the metal foils and the prepreg sheet 31 varies, and peeling is likely to occur by impact. Accordingly, part of the conductive paste may be peeled off. In this conventional method, conditions of these steps have large effects on the quality of the two-sided circuit board.

SUMMARY OF THE INVENTION

A mask film for manufacturing a circuit board of the invention comprises a base material, a parting layer placed on the base material, and a non-parting portion.

A manufacturing method of circuit board of the invention comprises:

(a) a step of preparing a mask film, in which the mask film comprises a base material, a parting layer and a non-parting portion placed on the base material, (b) a step of adhering the mask film to both sides of a prepreg sheet, in which the parting layer and non-parting portion are adhered to the prepreg sheet, (c) a step of forming a penetration hole in specified positions of the prepreg sheet having the mask film, (d) a step of filling the penetration hole with conductive paste from the mask film side, using the mask film as the mask, (e) a step of parting the mask film from the prepreg sheet, (f) a step of overlaying metal foils on both sides of the prepreg sheet, (g) a step of heating and pressing the prepreg sheet having the metal foils, and adhering the prepreg sheet and metal foils mutually, so that the metal foils placed at both sides are connected electrically with each other through the conductive paste filling up the penetration hole, and (h) a step of etching the metal foils selectively to form circuit patterns.

Preferably, the parting layer is placed on the surface of the base material, the non-parting portion is formed on the surface of the base material, and the non-parting portion is formed in the region excluding the parting layer.

Preferably, the non-parting portion is formed at both ends along the length direction of the base material, parallel to the both ends.

Preferably, the non-parting portion has an adhesive layer or adhesion strength adjusting pattern.

In this constitution, an optimum adhesion strength between mask film and prepreg sheet is assured, and peeling between mask film and prepreg sheet is prevented. Further, a fusing adhesion between mask film and prepreg sheet by heat when forming penetration holes is prevented. As a result, a circuit board having an excellent quality is obtained.

REFERENCE NUMERALS

Figure 1:
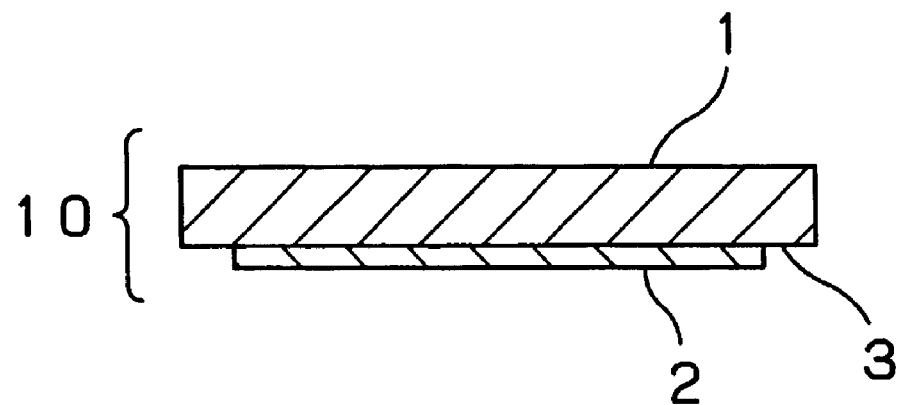
FIG. 1 is a sectional view of a mask film in an embodiment of the invention.

1 Base material
2 Parting layer
3 Non-parting portion
4 Adhesive layer
5 Adhesion-strength-adjusting pattern
6 Air-invasion-preventing portion
10, 10a, 10b Mask film
21 Prepreg sheet
23 Penetration hole
24 Conductive paste
25, 25a, 25b Metal foil

DETAILED DESCRIPTION OF THE INVENTION

A mask film in an embodiment of the invention comprises a base material, a parting layer and a non-parting portion placed at a specified position on one side of the base material. A mask film in other embodiment comprises a base material, a parting layer placed on the entire surface of one side of the base material, and an adhesive layer placed at a specified position on the parting layer.

A manufacturing method of circuit board in an embodiment of the invention comprises a step of adhering the mask film on both sides of a prepreg sheet, a step of forming penetration holes in the prepreg sheet having the mask film, a step of filling the penetration holes with conductive paste, a step of peeling off the mask film, a step of placing a metal foil on both sides of the prepreg sheet so as to contact electrically with the conductive paste, and a step of forming an electric circuit in the metal foil. In this method, the mask film has a special composition as described above.

In this constitution, when the mask film and the prepreg sheet are glued or adhered together, the parting layer has a parting performance, and the non-parting portion has a adhesion reinforcing performance. The non-parting portion has an action of preventing peeling between the mask film and prepreg sheet.

By manufacturing a circuit board by using such mask film, a circuit board having an excellent quality is obtained.

Preferably, the parting layer is formed in a region excluding the both ends of the base material. Accordingly, the non-parting portion is disposed at both ends of the base material. Hence, the adhesive layer for preventing peeling after gluing of the mask film and prepreg sheet can be formed at both ends of the base material.

Preferably, the mask film has an adhesive layer disposed in the non-parting portion. In this constitution, peeling after gluing between the mask film and prepreg sheet is prevented. It is further easier to set the degree of peeling when parting the mask film from the prepreg sheet.

Preferably, the adhesive layer has an adhesion strength adjusting pattern for adjusting the adhesion strength. In this constitution, it is possible to set the adjustment of the strength when parting the mask film from the prepreg sheet.

Preferably, the non-parting portion has an air invasion preventing pattern for preventing invasion of air. In this constitution, invasion of air into the space between the mask film and prepreg sheet is prevented. As a result, peeling of mask film due to invasion of air is prevented.

A mask film in an embodiment of the invention comprises a base material, a parting layer placed on the entire surface of one side of the base material, and an adhesive layer placed at a specified position on the parting layer. In this constitution, only the parting layer is preliminarily formed at a specified position on the base material, and the productivity of manufacture of mask film is enhanced. Further, when the mask film and prepreg sheet are glued together, the parting layer has a parting performance, and the adhesive layer has an excellent adhesion performance. The adhesive layer has an action of preventing peeling between the mask film and prepreg sheet.

Preferably, the adhesive layer is formed at both ends on the patting layer in a specific width. In this constitution, peeling after gluing of the mask film and prepreg sheet is prevented. It is further easier to adjust the degree of peeling when parting the mask film from the prepreg sheet.

Preferably, the adhesive layer has an adhesion strength adjusting pattern for adjusting the adhesion strength. In this constitution, it is possible to set the adjustment of the strength when parting the mask film from the prepreg sheet.

Preferably, the non-parting portion has an air invasion preventing pattern for preventing invasion of air. In this constitution, invasion of air into the space between the mask film and prepreg sheet is prevented. As a result, peeling of mask film due to invasion of air is prevented.

Preferably, the adhesion strength adjusting pattern has a plurality of linear patterns disposed parallel to the longitudinal direction of the base material. This constitution has an adhesion strength optimum only when preventing peeling after gluing between the mask film and prepreg sheet, and at the same time, when parting the mask film from the prepreg sheet, the film can be easily separated. It is also easier to manufacture the mask film having an adhesive layer of linear pattern.

Preferably, the adhesion strength adjusting pattern has an air invasion preventing pattern formed parallel to the longitudinal direction of the base material and formed at the inner side of a specific distance from the end of the base material, and a discontinuous pattern formed vertically to the longitudinal direction of the base material. This constitution prevents invasion of air into the parting layer. It further prevents staying of air in the adhesion strength adjusting pattern. As a result, peeling of adhesive layer due to external pressure or the like is prevented.

Preferably, the parting layer has a surface tension of 40 mN/m or more. In this constitution, the adhesive power of the mask film and prepreg sheet is enhanced. Further, an adhesive power not causing problems such as peeling in the manufacturing process is obtained.

Preferably, the parting layer has a processed layer processed by corona discharge or plasma discharge. In this constitution, the surface of the parting side is activated, and the adhesive power of the mask film and prepreg sheet is enhanced. Further, when the surface tension of the parting layer is 40 mN/m or more, the adhesion strength free from problems in the manufacturing process is obtained.

Preferably, the corona discharge is processed in the condition of voltage of 35 kV for 1 to 5 seconds. In this constitution, the surface activity having a surface tension of 40 mN/m or more is obtained. Accordingly, the wettability of the resin components in the prepreg sheet is improved. As a result, peeling is prevented.

Preferably, the parting layer is formed of a material not having melting point. In this constitution, when forming penetration holes in specified positions of the prepreg sheet by laser processing method, especially when forming penetration holes by heating process of $CO_2$ laser or the like, if the thermoplastic resin of the mask film is melted by the heat generated at the time of processing, the parting layer not having melting point plays the role of barrier, and the fusing adhesion of mask film and prepreg sheet is prevented to a minimum limit. As the material not having melting point, the thermosetting resin or inorganic matter is preferred.

Preferably, the material not having melting point has a thermosetting resin. In this constitution, when forming penetration holes by heating process by $CO_2$ laser or the like, if the thermoplastic resin of the mask film is melted by the processing heat during process, the parting layer formed of a thermosetting resin material utilizes the laser energy as the curing energy of the resin. Accordingly, the thermosetting resin plays the role of barrier for expanding the fusion region of the mask film. As a result, the fusing adhesion of the mask film and prepreg sheet is prevented.

Preferably, the adhesive layer is formed of a thermoplastic resin not having adhesiveness at ordinary temperature. In this constitution, the adhesibable property at ordinary temperature is small, and it is easier to handle. Further, by heating when adhering the mask film and prepreg sheet, it is melted again, and is adhered easily.

Preferably, the base material is made of a material not having melting point. In this constitution, if the mask film has effects of heat at the time of laser processing, the periphery of the processing holes is not melted, and the fusing adhesion between mask film and prepreg sheet occurs more hardly. In this case, softening may occur near the processing holes, but the fusing adhesion does not occur.

A manufacturing method of mask film in an embodiment of the invention comprises a step of preparing a paint containing an epoxy resin as main agent, a melamine crosslinking agent as a hardener, and methyl ethyl ketone as a solvent, a step of applying the paint on a base material by gravure process so that the finished film thickness may be 1 μm, and a step of forming a parting layer by drying and curing the applied paint.

In this method, a mask film having an excellent parting property and an excellent laser processing performance is obtained.

Preferably, the step of applying the paint on the base material includes a step of forming a parting agent applying portion and a non-parting portion not having parting agent, by using a roll gravure plate forming an unpainted portion not having parting agent on the roll gravure plate. In this method, a mask film having a parting layer having an excellent parting performance and an excellent laser processing performance, and a parting layer having an excellent adhesion to the end portion of the prepreg sheet is obtained.

A manufacturing method of a circuit board in an embodiment of the invention comprises a step of forming a penetration hole in a prepreg sheet having a mask film on both face and back sides, a step of filling the penetration hole with conductive paste, a step of parting the mask film from the prepreg sheet, a step of heating and pressing a metal foil on both face and back sides of the prepreg sheet, and electrically connecting the metal foil placed on the face side and the metal foil placed on the back side, and a step of forming a circuit by etching the metal foils.

The prepreg sheet has a compressible property so that the thickness is reduced by compression. The mask film comprises a base material, a parting layer and a non-parting portion placed at a specified position on one side of the base material. Or, the mask film comprises a base material, a parting layer disposed on the entire surface of one side of the base material, and an adhesive layer disposed at a specified position on the parting layer. In this constitution, when forming the penetration holes by heating process such as $CO_2$ laser, if the thermoplastic resin of the mask film is melted by the processing heat during process, the parting layer not having melting point serves as barrier. Accordingly, the fusing adhesion betwee prepreg sheet and mask film is prevented. Therefore, after being filled with conductive paste, when parting the mask film from the prepreg sheet, the peel strength is smaller. Further, the impact peel generated by presence or absence of the penetration hole is lessened. As a result, peeling of resin components in the prepreg sheet, aramid fiber and conductive paste is prevented.

Preferably, the non-parting portion or adhesive layer is formed at a position excluding the position of forming the penetration hole of the prepreg sheet. In this constitution, at the step of forming penetration holes by laser processing, the step of filling with conductive paste, and the process of parting the mask film, formation of improper penetration hole due to effects of adhesive layer formed on the non-parting portion is prevented, and favorable penetration hole is formed.

Preferably, at the step of parting the mask film from the prepreg sheet, parting of mask film is started from the non-parting portion side or adhesive layer side. The parting speed of the non-parting portion or adhesive portion at the end of parting is lower than the parting speed of the parting layer. In this constitution, the parting speed is low in the non-parting portion or adhesive layer having a strong adhesion strength, and the mask film is easily separated from the prepreg sheet.

Exemplary embodiments of the invention are described below while referring to the accompanying drawings.

Exemplary Embodiment 1

Figure 2:
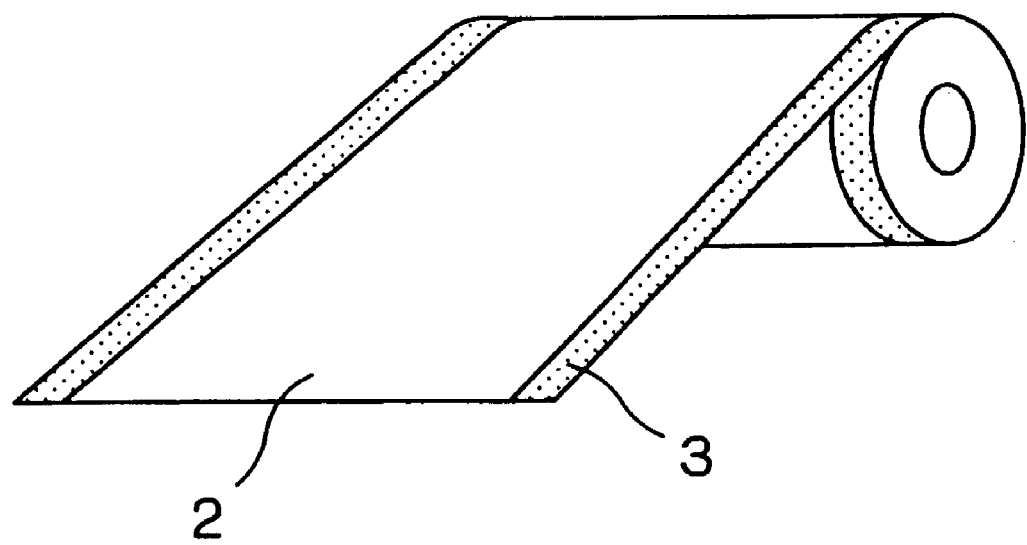
FIG. 2 is a perspective view of the mask film in the embodiment of the invention, showing the mask film forming a parting layer and a non-parting portion.
Figure 3A:
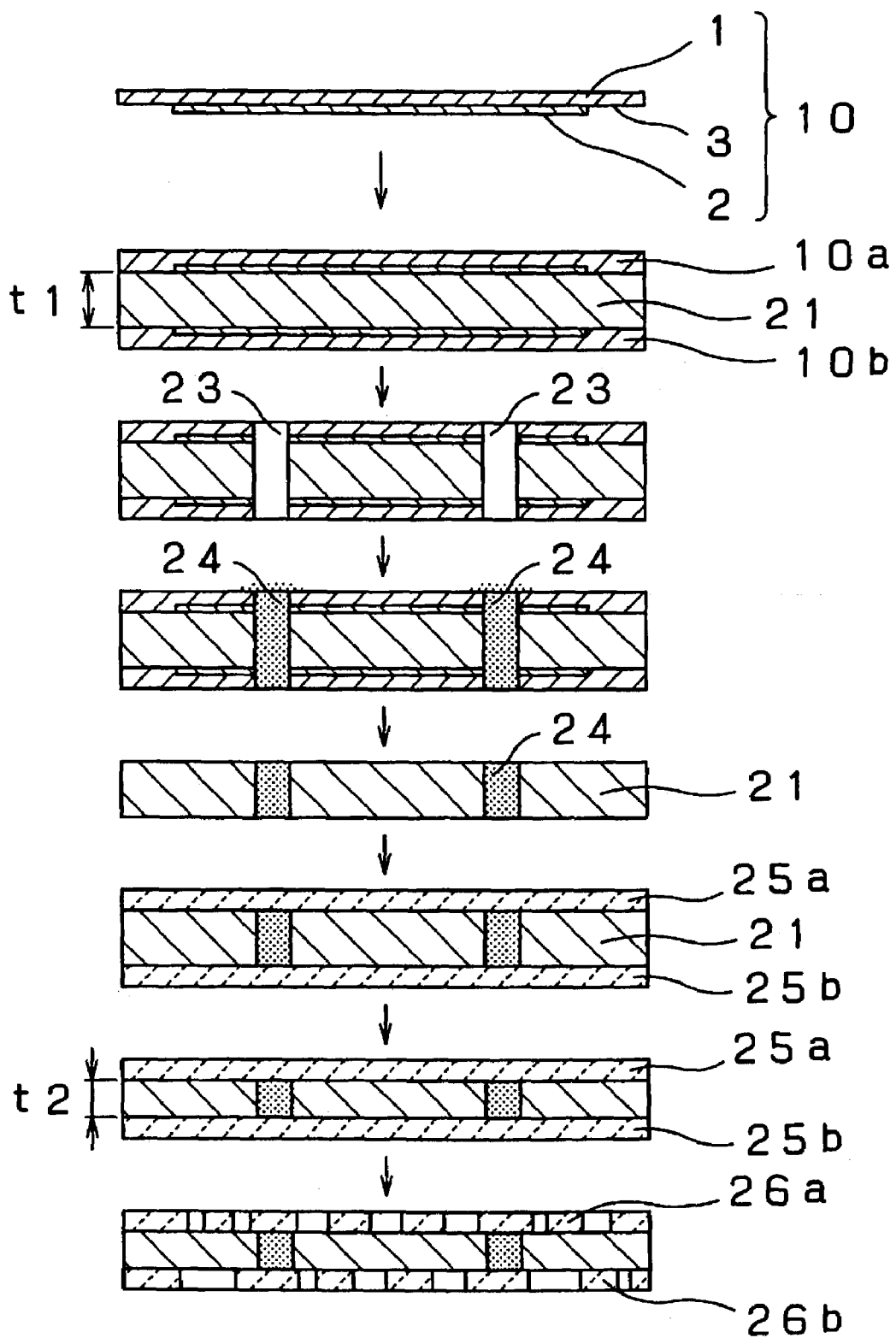
FIG. 3(a) is a process sectional view showing a manufacturing method of a two-sided circuit board in an embodiment of the invention.
Figure 3B:
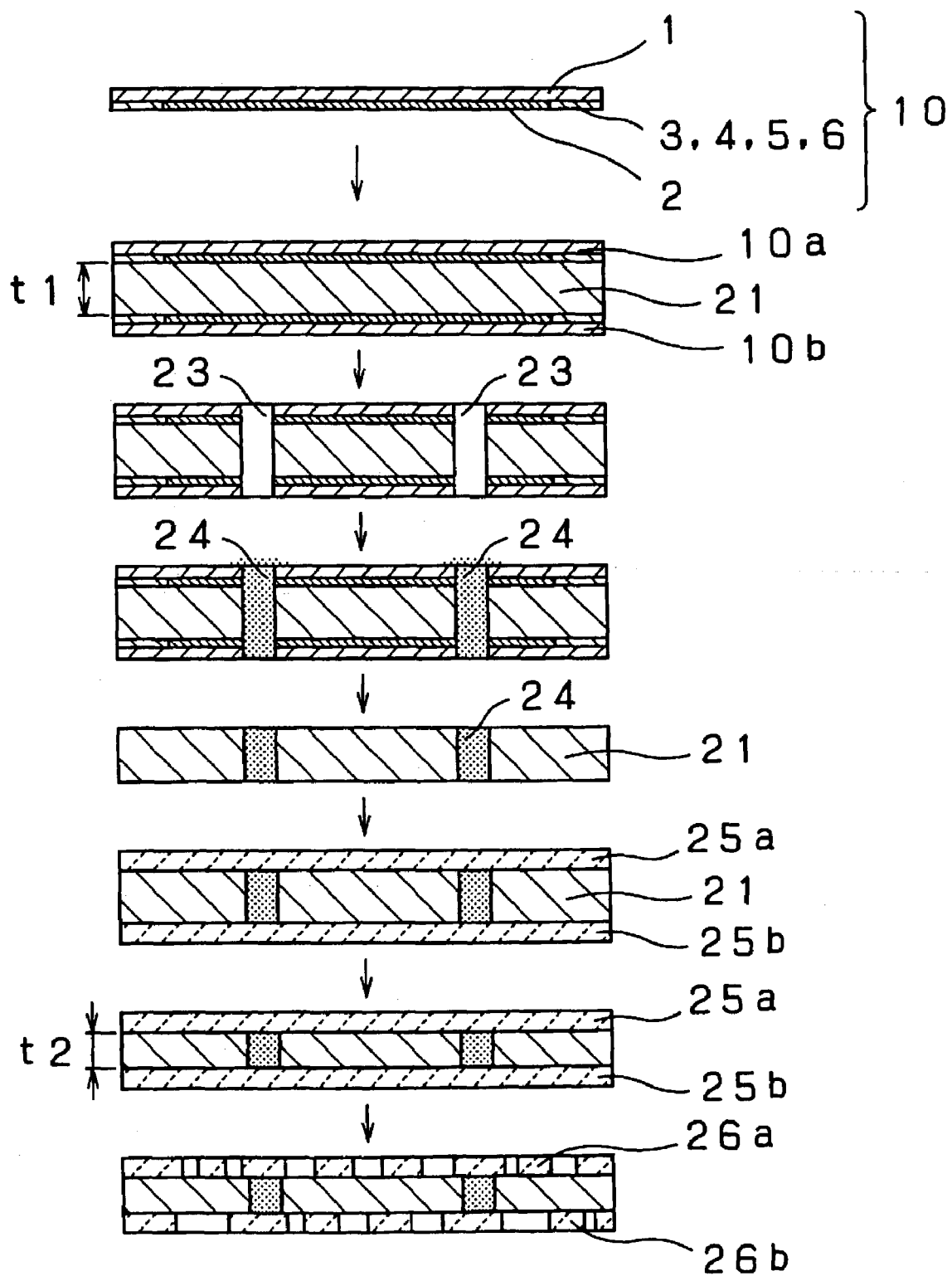
FIG. 3(b) is a process sectional view showing a manufacturing method of a two-sided circuit board in other embodiment of the invention.
Figure 5:
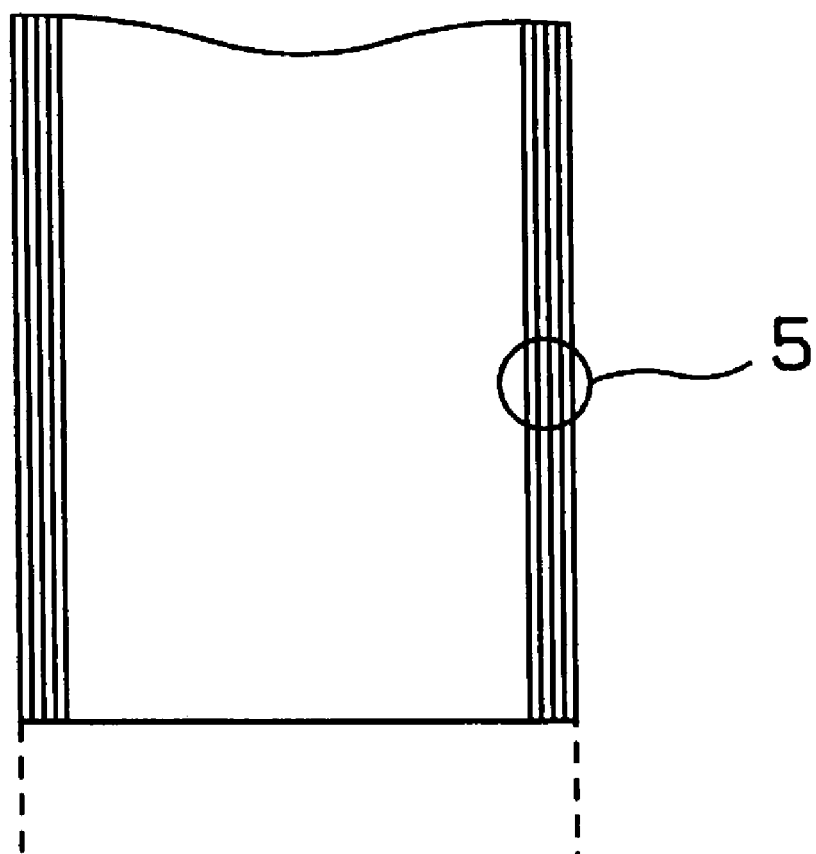
FIG. 5 shows a plan view and a sectional view of an adhesion strength adjusting pattern of the mask film in the embodiment of the invention.
Figure 5:
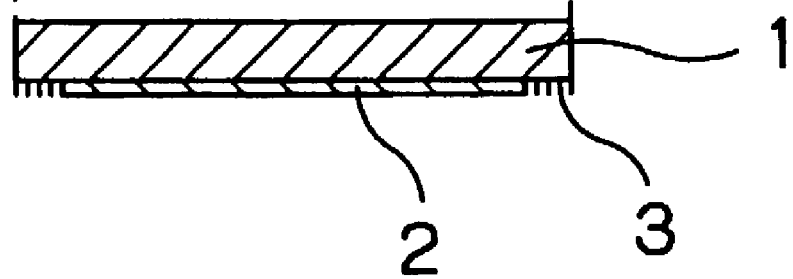
Figure 6:
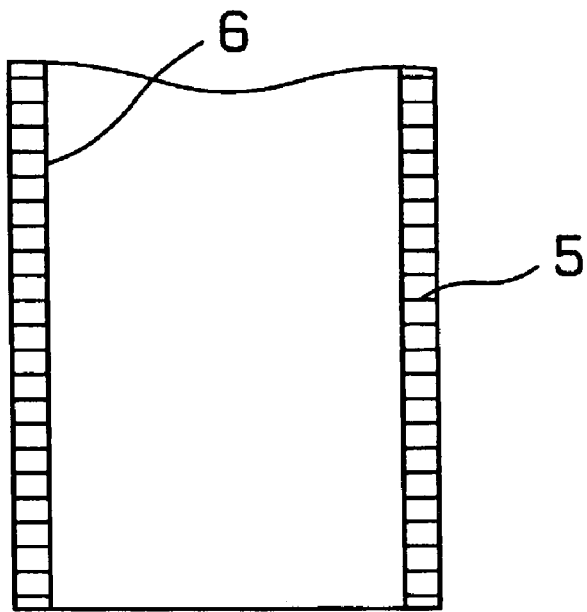
FIG. 6 is a plan view showing other adhesion strength adjusting pattern and an air invasion preventive portion of the mask film in the embodiment of the invention.

A sectional view of a mask film in an embodiment of the invention is described in FIG. 1. A perspective view showing a mask film forming a parting layer and a non-parting portion in the embodiment of the invention is given in FIG. 2. The process sectional view of manufacturing method of two-sided circuit board using the mask film of the embodiment is shown in FIG. 3(a) and FIG. 3(b). The easily peeled portion of the mask film of the embodiment, and the non-parting portion or adhesive layer are show in a plan view in FIG. 4. A plan view and a sectional view showing the adhesion strength adjusting pattern in an embodiment of the invention are given in FIG. 5. A plan view showing the second adhesion strength adjusting pattern and air invasion preventing portion in an embodiment of the invention is shown in FIG. 6.

Figure 4:
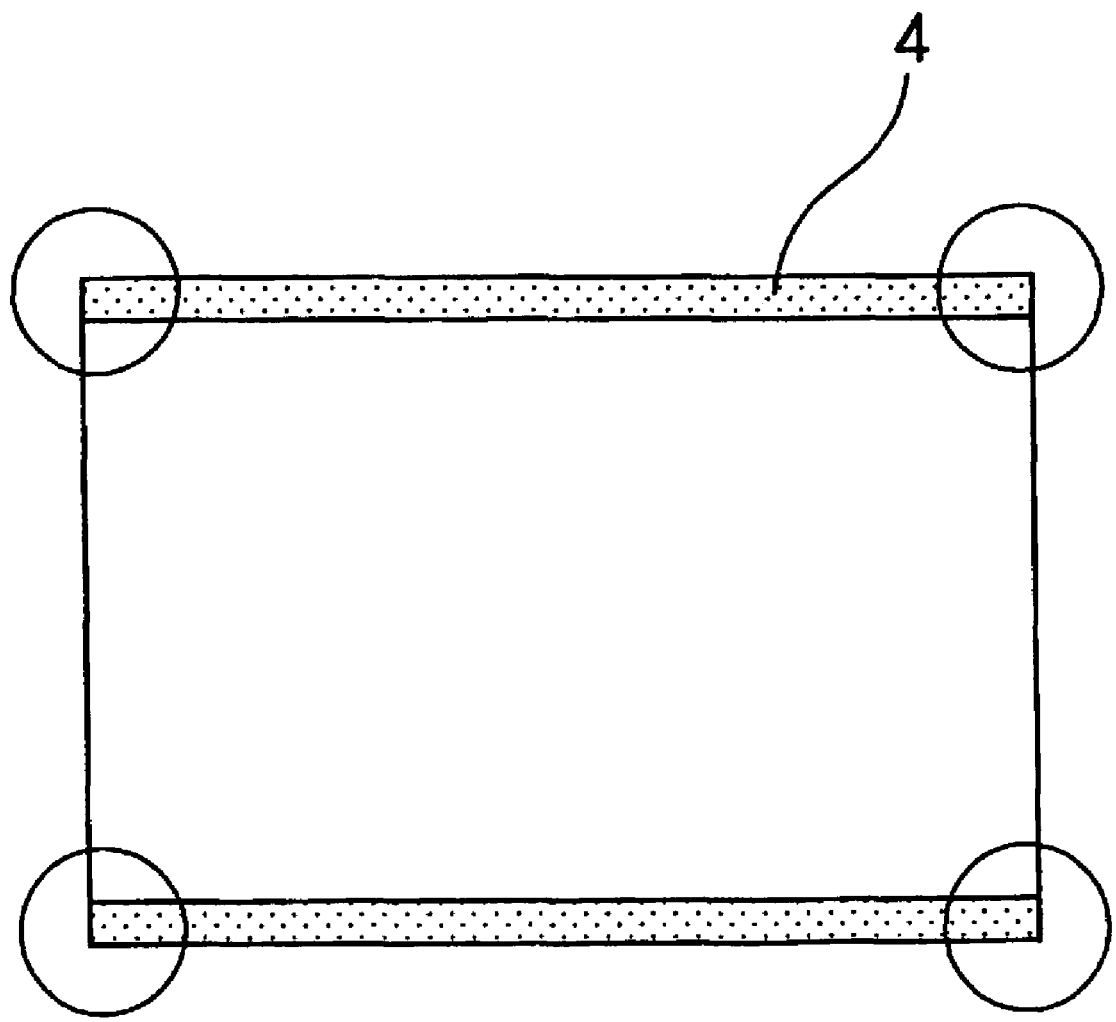
FIG. 4 is a plan view of a mask film in an embodiment of the invention, showing an easily peeling portion of the mask film, and a non-parting portion, or an adhesive layer.

In FIG. 1, a mask film 10 comprises a base material 1, a parting layer 2 and a non-parting portion 3 placed on the surface of the base material 1. The non-parting portion 3 can be adhered to a prepreg sheet 21. Preferably, the non-parting portion 3 has an adhesive layer 4 as shown in FIG. 4, or adhesion strength adjusting patterns 5, 6 as shown in FIG. 5 and FIG. 6.

A manufacturing method of two-side circuit board using the mask film 10 of the embodiment of the invention is described below.

FIG. 3(a) shows a manufacturing process of two-sided circuit board using the mask film 10 shown in FIG. 1. FIG. 3(b) shows a manufacturing process of two-sided circuit board using the mask film 10 having adhesive layers 4, 5, 6 as shown in FIG. 4, FIG. 5 and FIG. 6.

In FIG. 3(a) and FIG. 3(b), by laminating method, a mask film 10a is adhered to one side of a prepreg sheet 21 at a constant tension, and other mask film 10b is adhered to other side of the prepreg sheet 21. The thickness [t1] of the prepreg sheet 21 is about 150 μm. The prepreg sheet 21 has a nonwoven cloth, and a thermosetting resin impregnated in the nonwoven cloth. This thermosetting resin is not cured completely. As the nonwoven cloth, aromatic polyamide fiber, aramid fiber, glass fiber, ceramic fiber or other fiber having a high heat resisting temperature is used. As the thermosetting resin, for example, epoxy resin, melamine resin, or unsaturated polyester resin may be used. In this embodiment, the aramid fiber nonwoven cloth and epoxy resin were used.

In this process, the parting layer 2 and non-parting portions 3, 4, 5, 6 are adhered to the surface of the prepreg sheet 21. In a constitution in which the non-parting portion 3 does not have adhesive layer 4, or adhesion strength adjusting pattern 5 or 6, the adhesion strength between the non-parting portion 3 and prepreg sheet 21 has a specified adhesion strength. In a constitution in which the non-parting portion 3 has the adhesive layer 4, or adhesion strength adjusting pattern 5 or 6, the adhesion strength between the non-parting portion 3 and prepreg sheet 21 have an adjusted adhesion strength.

Penetration holes 23 are formed in specified positions of the prepreg sheet 21 to which the mask films 10a, 10b are adhered, by laser processing method or the like.

The penetration holes 23 are filled with conductive paste 24. The method of filling with conductive paste 24 comprises a step of plating the prepreg sheet 21 having penetration holes 23 on a table of a general printing press (not shown), and a step of applying the conductive paste 24 directly from above the mask film 10a by means of urethane rubber squeegee or the like. At this time, the mask films 10a, 10b play the role of printing mask and the role of prevention of contamination of the surface of the prepreg sheet 21.

The mask films 10a, 10b are separated from both sides of the prepreg sheet 21.

Metal foils 25a, 25b of Cu or the like are overlaid on both sides of the prepreg sheet 21. The metal foils 25a, 25b have a thickness of about 35 μm.

By heating and pressing the prepreg sheet 21 having the metal foils 25a, 25b by hot press, the thickness of the prepreg sheet 21 is compressed. By this compression, the thickness t2 of the prepreg sheet 21 after compression is about 100 μm, and the prepreg sheet 21 and metal foils 25a, 25b are mutually adhered. In this case, the metal foils 25a, 25b placed at both sides are electrically connected to the conductive paste 24 applied in the penetration holes 23 formed at specified positions. Further, by this heating and pressing, the thermosetting resin contained in the prepreg sheet 21 is completely cured.

The both metal foils 25a, 25b are selectively etched, and circuit patterns 26a, 26b are formed. Thus, the metal foil 25a and metal foil 25b are electrically connected through the conductive paste applied in the penetration holes, and a two-sided circuit board is manufactured.

The mask film 10 is further described below.

In FIG. 1 through FIG. 6, the mask film 10 has a base material 1, and a parting layer 2 and a non-parting portion 3 formed on the surface of the base material.

The base material 1 has a shape of 12 μm in thickness and 300 mm in width. The base material 1 is made of thermoplastic resin, such as polyethylene terephthalate (PET), polyphenylene sulfite (PPS), or polyethylene naphthalate (PEN). That is, the base material 1 has a property of being fused by heat.

The parting layer 2 is placed in a region excluding the both ends along the length direction of the mask film 10. The parting layer 2 is made of a material not having melting point, for example, thermosetting resin or inorganic material. That is, the parting layer 2 has a property of not being fused by heat. The parting layer 2 is manufactured in the process comprising a step of preparing a paint having epoxy resin as main agent, melamine crosslinking agent as hardener, and methyl ethyl ketone (MEK) as solvent, and a step of applying the paint on the base film 1 by gravure process or the like so that the finish film thickness may be 1 μm, and drying and curing.

The non-parting portion 3 is formed at both ends along the length direction of the mask film 10. The non-parting portion 3 is formed simultaneously when the parting layer 2 is placed as shown in FIG. 2, by forming an unpainted portion not containing parting agent, on the roll gravure plate, at the step of forming the parting layer 2. The parting layer 2 and non-parting portion 3 are formed continuously. In the non-parting portion 3 shown in FIG. 1 and FIG. 2, the base material 1 is exposed on the surface. Since the non-parting portion 3 does not have parting performance, at the step of adhering the mask film 10 and prepreg sheet 21, the same adhesion strength as when the base material 1 and prepreg sheet 21 are directly adhered is obtained. The adhesion strength between the mask film 10 and prepreg sheet 21 shown in FIG. 1 was measured in the conditions of 180-degree peel and measuring speed of 60 mm/min. As a result, the adhesion strength between the parting layer 2 and prepreg sheet 21 was about 0.5 g/10 mm. The adhesion strength of the non-parting portion 3 and prepreg sheet 21 was about 100 g/10 mm or more. Thus, the adhesion strength between the non-parting portion 3 and prepreg sheet 21 is stronger than the adhesion strength between the parting layer 2 and prepreg sheet 21.

Preferably, as shown in FIG. 4, an adhesive layer 4 is placed in the non-parting portion 3. When gluing the prepreg sheet 21 and mask film 10, the easily peeling positions of the mask film 10 are four corners. At the four corners, the tension acts most strongly. Therefore, by placing the adhesive layer 4, the adhesion strength at the four corners is reinforced, and peeling between the mask film 10 and prepreg sheet 21 is prevented. Further, progress of peeling is arrested.

In FIG. 2, the non-parting portion 3 is formed at both sides in the width direction of the mask film 10. The non-parting portion 3 may also have an adhesion strength adjusting pattern 5 as shown in FIG. 5 or FIG. 6.

In FIG. 5, the adhesion strength adjusting pattern 5 consists of the non-parting portion 3 and parting layer 2 formed in pattern shapes alternately and continuously, parallel to the length direction of the base material 1.

In FIG. 6, the adhesion strength adjusting pattern 5 consists of the non-parting portion 3 and parting layer 2 formed in pattern shapes alternately and discontinuously, orthogonal to the length direction of the base material 1.

If the adhesion strength of the non-parting portion 3 is too strong and separation of mask film is difficult at the step after filling with conductive paste, by the adhesion strength adjusting pattern 5 of the non-parting portion 3, the adhesion strength between the mask film 10 and prepreg sheet 21 can be freely adjusted. As a result, the mask film can be separated easily.

The adhesion strength adjusting pattern 5 is not limited to the shapes shown in FIG. 5 and FIG. 6, but the adhesion strength adjusting pattern 5 can be formed in any pattern capable of adjusting the area of the non-parting portion 3.

The adhesion strength adjusting pattern 5 includes, as shown in FIG. 6, an air invasion preventing portion 6 formed in a pattern shape formed parallel to the length direction of the base material 1. This air invasion preventing portion 6 formed parallel is formed continuously, or independently in part, or discontinuously. This configuration prevents invasion of air into the parting layer 2 due to peeling in the weak adhesive strength portion.

Preferably, in particular, the adhesion strength adjusting pattern 5 should have the pattern shapes of the non-parting portion 3 and parting layer 2 formed alternately and discontinuously, orthogonal to the length direction of the base material 1, and the air invasion preventing portion 6. This configuration prevents expansion of peel occurring due to passing of air among the patterns to push out to the central part of the parting layer 2 at the subsequent pressing and other steps.

Surface properties of the parting layer 2 are reformed by surface treatment, such as corona process of applying corona discharge on the surface of the parting layer 2, or plasma process of applying plasma discharge. By this surface treatment, the adhesion strength of the parting layer 2 to the prepreg sheet 21 is enhanced. The surface tension of the parting layer 2 not having surface treatment is about 32 dynes. By corona process in the conditions of voltage of 35 kV and 1 to 5 seconds, the surface tension of the parting layer 2 is 40 dynes. That is, the wettability of the parting layer 2 to the resin component in the prepreg sheet 21 is improved. More specifically, when the surface tension of the parting layer 2 is 32 dynes, the adhesion strength between the parting layer 2 and prepreg sheet 21 is about 0.5 g/10 mm. By contrast, when the surface tension of the parting layer 2 is 40 dynes, the adhesion strength between the parting layer 2 and prepreg sheet 21 is about 4 g/10 mm. Thus, by corona process, the adhesion strength between the parting layer 2 and prepreg sheet 21 is enhanced, and peeling between the parting layer 2 and prepreg sheet 21 is prevented. Herein, the adhesion strength between the parting layer 2 and prepreg sheet 21 was measured in the condition of 180-degree peel and measuring speed of 60 mm/min. Thus, since the adhesion strength between the parting layer 2 and prepreg sheet 21 is improved, peeling between parting layer 2 and prepreg sheet 21 can be prevented at the step of opening the penetration holes 23 and at the step of filling the penetration holes 23 with conductive paste. As a result, accurate forming of penetration holes 23 and accurate filling with conductive paste are realized.

At the step of forming penetration holes 23 in the prepreg sheet 21 to which the mask film 10 is adhered, it is possible to open holes by laser process such as $CO_2$ laser. In such $CO_2$ laser process, heat is generated in process. By this heat, the base material 1 (thermoplastic resin) positioned around the penetration holes 23 may be melted. If this base material 1 is melted, the parting layer 2 made of thermosetting resin not having melting point plays the role of barrier for preventing fusion of the base material 1 and prepreg sheet 21. Therefore, the fusing adhesion between base material 1 and prepreg sheet 21 is held to a minimum limit. Or, the fusing adhesion between base material 1 and prepreg sheet 21 is prevented. As a result, at the step of separating the mask film 10 from the prepreg sheet 21 after filling with conductive paste 24, the peel strength is smaller, so that the mask film 10 can be easily separated from the prepreg sheet 21. That is, the generated impact peel is lessened by presence or absence of penetration holes. As a result, peeling of the resin component in the prepreg sheet, aramid fiber or conductive paste can be prevented.

Preferably, the penetration holes 23 should be formed in the parting layer 2. The penetration holes 23 are preferred to be formed in a region excluding the non-parting portion 3. In this constitution, no inconvenience occurs at the step of forming penetration holes by laser process, step of filling with conductive paste, or step of separating mask film. If the penetration holes 23 are formed in the non-parting portion 3, the base material and the prepreg sheet may be melted when forming penetration holes by heating process, and the resin component in the prepreg sheet, aramid fiber and conductive paste are likely to peel off at the step of separating the mask film 10 from the prepreg sheet 21.

At the step of separating the mask film 10 from the prepreg sheet 21, when starting to separate the mask film 10 from the non-parting portion 3, the peeling speed of the non-parting portion 3 is preferred to be lower than the peeling speed of the parting layer 2. For example, the peeling speed of the non-parting portion 3 is about 20 mm/min, and the peeling speed of the parting layer 2 is 40 mm/min. By setting the peeling speed of the non-parting portion 3 lower than the peeling speed of the parting layer 2, the peel strength when separating the non-parting portion 3 is smaller. Accordingly, the mask film 10 is separated stably. The peeling speed of the mask film 10 is preferred to be low in both parting layer 2 and non-parting portion 3, and it is possible to separate stably in this case. It is preferred that the peeling speed be set in a range not to lower the productivity.

Exemplary Embodiment 2

The constitution and function of the mask film in the embodiment are explained below. The manufacturing method of the two-sided circuit board is same as in Exemplary Embodiment 1, and its explanation is omitted.

Figure 7:
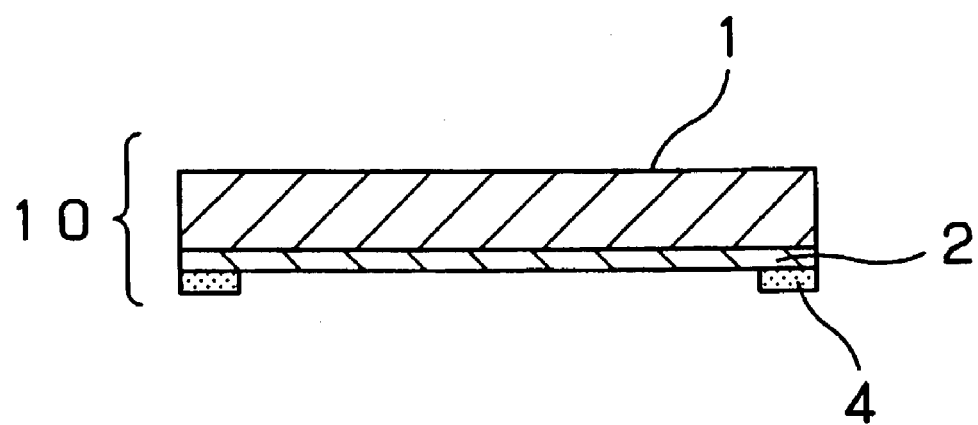
FIG. 7 is a sectional view of a mask film in other embodiment of the invention.
Figure 8:
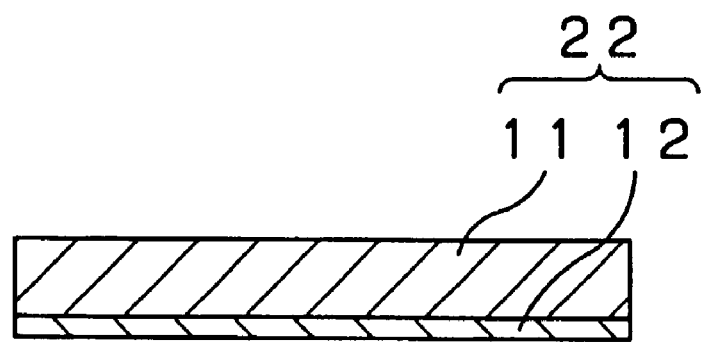
FIG. 8 is a sectional view of a mask film in a prior art.
Figure 9:
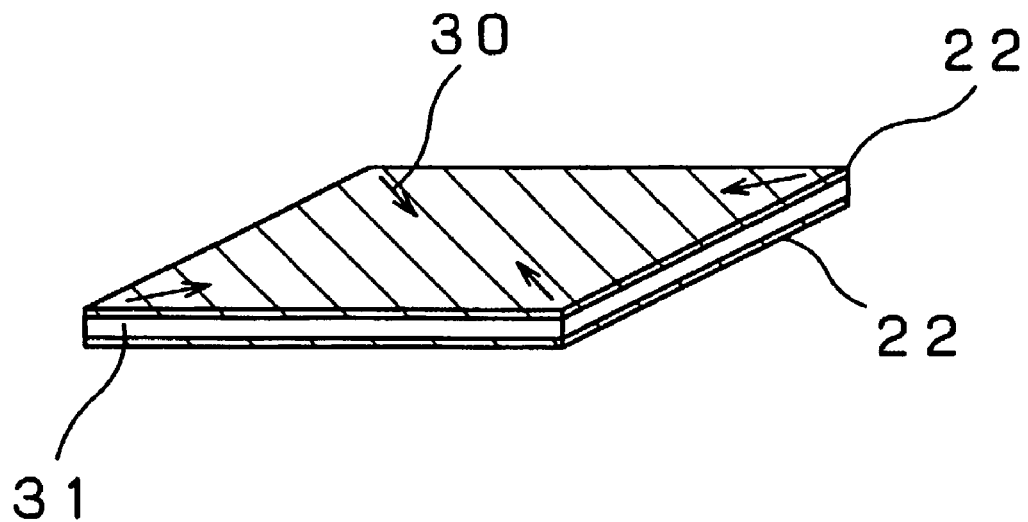
FIG. 9 is a perspective view showing the position of a large tension of the mask film in the prior art.

A sectional view of the mask film of Exemplary Embodiment 2 of the invention is shown in FIG. 7. In FIG. 7, a mask film 10 comprises a base material 1, a parting layer 2 placed on the surface of the base material, and an adhesive layer 4 placed on the parting layer 2.

The base material 1 is made of cellophane material. The base material 1 is manufactured by casting a solution containing pulp. The base material 1 has a band shape of 20

μm in thickness and 300 mm in width. The parting layer 2 of about 1 μm in thickness is formed on the entire surface of one side of the base material 1.

The adhesive layer 4 of about 0.3 μm in thickness is formed on the parting layer 2. The parting layer 2 is made of a thermosetting resin not having melting point. The placing method of the parting layer 2 comprises a step of applying a mixture of epoxy resin as main agent, melamine crosslinking agent as hardener, and methyl ethyl ketone (MEK) as solvent, on the surface of the base material 1 by gravure process or the like, and a step of drying and curing the applied mixture. The parting layer 2 has a film thickness of about 1 μm.

The adhesive layer 4 is made of a material not have adhesiveness at room temperature, and having a fusing property when heated. As such material, the thermoplastic resin is preferred. Usable examples of thermoplastic resin include polyester or acrylic resin. The placing method of the adhesive layer 4 comprises a step of applying a mixture of thermoplastic resin and methyl ethyl ketone at a specified position of the parting layer 2, and a step of drying the applied mixture. In this process, the adhesive layer 4 is formed on both ends of the parting layer 2. By using a thermoplastic parting resin not having adhesiveness at room temperature as the adhesive layer 4, the adhesion is small at ordinary temperature and it is easy to handle, and hence at the step of gluing with the prepreg sheet, the adhesive layer 4 is melted by heating and is easily adhered, and the adhesion strength is increased.

The adhesion strength of the mask film and prepreg sheet thus manufactured in about 0.5 g/10 mm in the parting layer 2, and about 100 g/10 mm or more in the adhesive layer 4. The adhesion strength was measured in the condition of 180-degree peel and measuring speed of 60 m/min.

By using the mask film manufactured in this manner, the same effects as in Exemplary Embodiment 1 are obtained. That is, when this base material 1 is melted, the parting layer 2 made of the thermosetting resin not having melting point plays the role of prevention of the fusing adhesion between base material 1 and prepreg sheet 21. Therefore, the fusing adhesion between base material 1 and prepreg sheet 21 is held to a minimum limit. Or, fusion of base material 1 and prepreg sheet 21 is prevented. As a result, at the step of separating the mask film 10 from the prepreg sheet 21 after filling with conductive paste 24, the peel strength is smaller, and the mask film 10 can be easily separated from the prepreg sheet 21. As a result, peeling of resin component in the prepreg sheet, aramid fiber and conductive paste can be prevented.

Preferably, the penetration holes 23 should be formed in the parting layer 2. The penetration holes 23 are preferred to be formed in a region excluding the adhesive layer 4. In this constitution, no inconvenience occurs at the step of forming penetration holes by laser process, step of filling with conductive paste, and step of separating the mask film. If the penetration holes 23 are formed in the adhesive layer 4, the base material and the prepreg sheet are likely to be adhered when forming the penetration holes by heating process, and hence at the step of separating the mask film 10 from the prepreg sheet 21, the resin component in the prepreg sheet, aramid fiber and conductive paste are likely to be peeled off.

Preferably, the adhesive layer 4 has an adhesion strength adjusting pattern 5 as explained in Exemplary Embodiment 1. The adhesion strength adjusting pattern 5 has pattern shapes as shown in FIG. 5 or FIG. 6.

As described herein, the optimum adhesion strength between the mask film and prepreg sheet is maintained, and peeling of mask film and prepreg sheet is prevented. It further prevents the fusing adhesion between the mask film and prepreg sheet due to heat when forming the penetration holes, so that a circuit board having an excellent quality is obtained.

The invention claimed is:

1. A manufacturing method of mask film for manufacturing circuit board comprising the steps of:
    (a) applying a resin mixed solution at a specified position on a base material,
        in which said resin mixed solution contains a solvent, an epoxy resin dissolved in said solvent, and a melamine hardener dissolved in the solvent, and
        the applied resin mixed solution has a specified pattern, and
    (b) forming a parting layer by drying and curing the applied resin mixed solution,
        in which a region excluding the parting layer forms a non-parting portion.

2. The manufacturing method of mask film of claim 1, wherein the step of applying the resin mixed solution includes a step of applying the resin mixed solution on the base material by gravure process.

3. The manufacturing method of mask film of claim 1, wherein the step of applying the resin mixed solution includes a step of applying the resin mixed solution on a roll gravure plate, and
    a step of transferring the resin mixed solution applied on the gravure plate onto the base material, the gravure plate having a portion free from the resin mixed solution, said free portion forming the non-parting portion.

4. The manufacturing method of mask film of claim 1, wherein said base material is formed of a material not having melting point.

5. The manufacturing method of mask film of claim 1, wherein said base material has a band shape, and the non-parting portion is formed in the end region along the length direction of the base material in the band shape.

6. The manufacturing method of mask film of claim 1, further comprising a step of (c) placing an adhesive layer on the base material, wherein said non-parting portion includes said adhesive layer.

7. The manufacturing method of mask film of claim 1, wherein said adhesive layer has an adhesion strength adjusting pattern for adjusting the adhesion strength.

8. A manufacturing method of circuit board comprising the steps of:
    (a) forming a mask film, in which said mask film comprises a base material, a parting layer and a non-parting portion placed on the base material, wherein a region excluding the parting layer forms the non-parting portion,
    (b) adhering said mask film to both sides of a prepreg sheet, in which both parting layer and non-parting portion are adhered to said prepreg sheet,
    (c) forming a penetration hole in specified positions of the prepreg sheet having the mask film,
    (d) filling the penetration hole with conductive paste from the mask film side, using the mask film as a mask,
    (e) parting the mask film from the prepreg sheet,
    (f) a step of overlaying metal foils on both sides of the prepreg sheet,
    (g) heating and pressing the prepreg sheet having the metal foils, and adhering the prepreg sheet and metal foils mutually, so that the metal foils placed at both sides are connected electrically with each other through the conductive paste filling up the penetration hole, and (h) etching the metal foils selectively to form a circuit pattern.

9. The manufacturing method of circuit board of claim 8, wherein the step of forming the mask film includes a step of placing the parting layer at the specified position of the base material.

10. The manufacturing method of circuit board of claim 8, wherein the step of forming the mask film includes
a step of placing the parting layer on the entire surface of one side of the base material, and
a step of placing an adhesive layer in a specified region on the surface of the parting layer, in which said adhesive layer forms the non-parting portion.

11. The manufacturing method of circuit board of claim 8, wherein the step of forming the penetration hole is to form the penetration forms in the region excluding the non-parting portion.

12. The manufacturing method of circuit board of claim 8, wherein the step of parting the mask film from the prepreg sheet includes a step of starting separation of the mask film from the non-parting portion, and
the mask film is separated so that a peeling speed of the non-parting portion may be lower than a peeling speed of the parting layer.

13. The manufacturing method of circuit board of claim 8, wherein the step of forming the mask film includes a step of applying a resin mixed solution on the base material by gravure process.

14. The manufacturing method of circuit board of claim 8, wherein the step of forming the mask film includes a step of applying resin mixed solution on a roll gravure plate, and a step of transferring the resin mixed solution applied on the gravure plate onto the base material, the gravure plate has a portion free from the resin mixed solution, and
said free portion forms the non-parting portion.

15. The manufacturing method of circuit board of claim 8, wherein said base material is formed of a material not having melting point.

16. The manufacturing method of circuit board of claim 8, wherein said base material has a band shape, and
the non-parting portion is formed in the end region along the length direction of the base material in the band shape.

17. The manufacturing method of circuit board of claim 8, wherein the step of forming the mask film includes a step of placing an adhesive layer on the base material, and
said adhesive layer has an adhesion strength adjusting pattern for adjusting the adhesion strength.

18. The manufacturing method of circuit board of claim 17, wherein said adhesion strength adjusting pattern has a plurality of linear patterns placed parallel to the length direction of the base material.

19. The manufacturing method of circuit board of claim 17,
wherein said adhesion strength adjusting pattern has
an air invasion preventing pattern formed parallel to the longitudinal direction of the base material and formed at the inner side of a specific distance from the end of the base material, and
a discontinuous pattern formed vertically to the longitudinal direction of the base material.

* * * * *